United States Patent
Gonzalez et al.

(10) Patent No.: US 7,493,179 B2
(45) Date of Patent: Feb. 17, 2009

(54) DIGITAL AUDIO SYSTEM AND METHOD THEREFOR

(75) Inventors: Octavio A. Gonzalez, Pflugerville, TX (US); Charles E. Seaberg, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1425 days.

(21) Appl. No.: 10/105,650

(22) Filed: Mar. 25, 2002

(65) Prior Publication Data

US 2003/0182109 A1    Sep. 25, 2003

(51) Int. Cl.
*G06F 17/00* (2006.01)
*H03G 3/00* (2006.01)

(52) U.S. Cl. .................... 700/94; 381/107; 381/109
(58) Field of Classification Search .................... 700/94; 381/104, 107, 108, 94.1, 94.2; 341/143, 341/144, 155, 200
See application file for complete search history.

(56) References Cited

U.S. PATENT DOCUMENTS

| | | | | |
|---|---|---|---|---|
| 5,204,677 | A * | 4/1993 | Akagiri et al. | 341/118 |
| 6,249,237 | B1 * | 6/2001 | Prater | 341/143 |
| 6,414,613 | B1 * | 7/2002 | Midya et al. | 341/143 |
| 6,804,291 | B1 * | 10/2004 | Easwaran et al. | 375/222 |

FOREIGN PATENT DOCUMENTS

JP    10-341121    12/1998

OTHER PUBLICATIONS

Kazuya, Iwata, "Digital Attenuator", Dec. 22, 1998, JPO, machine translation, Detailed Description pp. 1-6, Claims p. 1, Description of Drawings p. 1, Drawings pp. 1-2.*
Iwata, Kazuya, "Digital Attenuator", Dec. 22, 1998, English Translation of Japanese Patent 10-341121, pp. 1-25.*
Mitra, Sanjit K., "Digital Signal Processing", 2001, McGraw-Hill, second edition, pp. 813-822.*

* cited by examiner

*Primary Examiner*—Suhan Ni
*Assistant Examiner*—Daniel R Sellers
(74) *Attorney, Agent, or Firm*—Joanna G. Chiu; Daniel D. Hill

(57) ABSTRACT

Embodiments of the present invention relate generally to digital volume control in digital audio systems. One embodiment relates to a digital audio system having a digital audio processor and a digital volume control coupled to the digital audio processor. The digital volume control includes a feedback loop having an attenuator, and error determination unit, and a filter. The feedback loop determines the attenuation error and shifts the attenuation error beyond a predetermined digital audio range. The output of the digital volume control maintains a substantially constant SNR and THD with respect to the level attenuation over the predetermined digital audio range.

15 Claims, 1 Drawing Sheet

DIGITAL AUDIO SYSTEM AND METHOD THEREFOR

FIELD OF THE INVENTION

The present invention relates generally to digital audio systems, and more specifically, but not limited, to digital volume control in digital audio systems.

RELATED ART

In digital audio systems, a digital source provides a digital audio signal which may then be converted to an analog signal and output via a speaker. In such systems, volume control of the digital signal may be desired. However, conventional volume control of the digital signal attenuates the digital signal, yet not any of the noise associated with the finite precision of the digital signal. For example, this noise may be introduced by the attenuation of the digital signal. This results in a degradation of signal to noise ratio (SNR) and total harmonic distortion (THD), especially as the attenuation increases.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
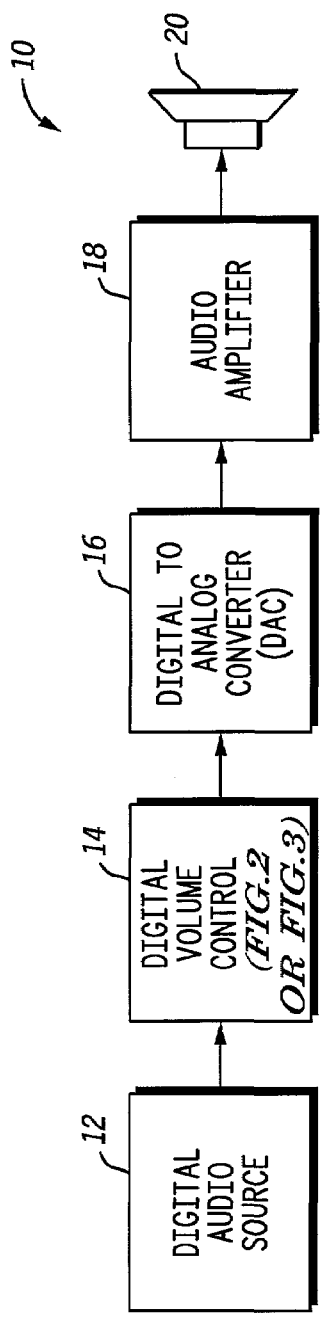
FIG. 1 illustrates, in block diagram form, a digital audio system in accordance with one embodiment of the present invention.

FIG. 1 illustrates a digital audio system 10 in accordance with one embodiment of the present invention. Digital audio system 10 includes digital audio source 12, digital volume control 14, digital to analog converter 16, audio amplifier 18, and speaker 20. Digital audio source 12 provides a digital audio signal (such as, for example, a digital bitstream) to digital volume control 14. In one embodiment, digital audio source 12 is a digital processor. The digital processor may receive an audio signal from a variety of difference sources, such as, for example, a CD, digitized radio or audio signal, etc. Alternatively, digital audio source 12 may be any type of analog to digital converter which is capable of providing a digital bitstream from any analog source. Digital volume control 14 attenuates the received digital audio signal from digital audio source 12. (Digital volume control 14 will be discussed further below in reference to FIGS. 2 and 3.) Digital volume control 14 provides the attenuated digital signal to digital to analog converter (DAC) 16 and DAC 16 then provides an analog signal to audio amplifier 18. Audio amplifier 18 outputs the amplified analog signal to speaker 20. In alternate embodiments, DAC 16 and audio amplifier 18 may be replaced with a digital amplifier (not shown) that is capable of amplifying and converting the input digital signal to provide an amplified analog signal to speaker 20. Also, the output of digital volume control 14 may be accessed directly for storage, or for further processing, such as, for example, in digital audio mixing applications, etc.

Figure 2:
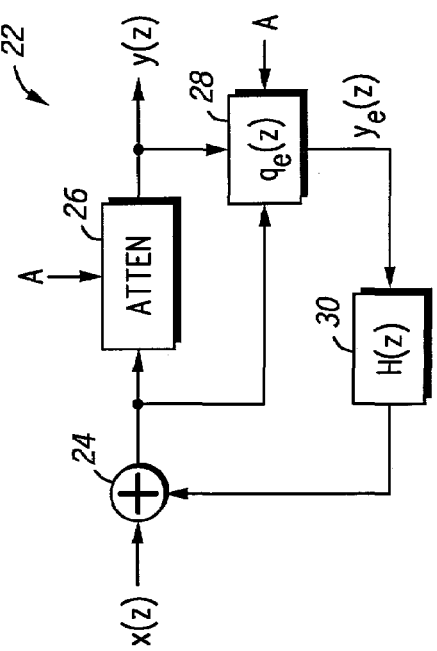
FIG. 2 illustrates, in block diagram form, one embodiment of the digital volume control of FIG. 1.

FIG. 2 illustrates one embodiment of a digital volume control 22. This digital volume control may be used within digital volume control 14 of FIG. 1. In this embodiment, digital volume control 22 includes adder 24 (also referred to as summation unit 24), coupled to receive an input digital audio signal x(z) and an output from a frequency shaping filter 30. The input signal x(z) is generally sampled at a higher rate than the Nyquist rate. This higher rate may also be referred to as the oversampling ratio. (For example, in one embodiment, this oversampling ration may be 32.) Digital volume control 22 also includes attenuator 26 which receives the output of adder 24 and an attenuation factor (A), and provides an output attenuated digital audio signal y(z). (Note that the output of adder 24 may also be referred to as a composite digital audio signal.) Error determination unit 28 receives y(z), the output of adder 24, the attenuation factor (A), and provides an error signal $y_e(Z)$ to filter 30. (Note that attenuator 26, error determination unit 28, filter 30, and adder 24 form part of a feedback loop within digital volume control 22.)

In operation, the output of attenuator 26, y(z), is a digitally attenuated representation of x(z). Note that y(z) also includes a frequency shaped attenuation error which is provided at the output of filter 30. Error determination unit 28 determines the error in the output signal y(z) introduced by the attenuation process (i.e. attenuator 26). This error $y_e(z)$ is filtered and frequency shaped so as to shift the error to a frequency band outside of a predetermined digital audio range. For example, the error may be shifted beyond a digital bandwidth of 22.05 kHz, 44.1 kHz, or beyond any desired range. Therefore, filter 30 may be implemented in a variety of different ways to perform this error filtering and shifting. One example will be discussed further below in reference to FIG. 3. Furthermore, any predetermined digital audio range may be defined. The filtered and frequency shaped error at the output of filter 30 is added into the input signal x(z) via adder 24. Therefore, attenuator 26 attenuates the combination of input signal x(z) and any error at the output of filter 30.

Note that the oversampling ratio discussed above allows for any error introduced by attenuator 26 to be frequency shifted beyond the predetermined digital audio band. In alternate embodiments, a larger oversampling ratio may be used in order to shift the attenuation error beyond a wider frequency range.

Note also that the attenuation factor, A, allows for the digital volume to be controlled by a user or by a process or unit within digital audio system 10 where the attenuation factor affects the amplitude of the digital signal. For example, a volume knob controlled by the user may be converted into various different attenuations factors depending on the knob's setting. Therefore, in one embodiment, A may be any integer value (such as any power of 2 which may used in a hardware implementation), or alternatively, A may be represented as real numbers with various degrees of precision. Alternatively, A may be automatically controlled from within digital audio system 10 in response to various conditions detected by the digital audio system 10. Thus the variability of the attenuation factor allows for digital volume control.

Figure 3:
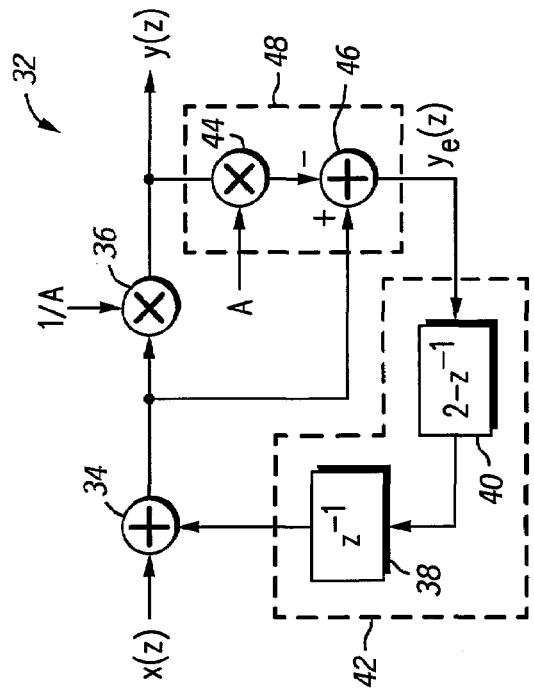
FIG. 3 illustrates, in block diagram form, one embodiment of the digital volume control of FIG. 2.

FIG. 3 illustrates a digital volume control 32. Digital volume control 32 is one embodiment of digital volume control 22 of FIG. 2. That is, filter 42 may be one embodiment of filter 30, multiplier 36 may be one embodiment of attenuator 26, and error determination unit 48 may be one embodiment of error determination unit 28. Therefore, the overall function of digital volume control 32 is analogous to the function of digital volume control 22. However, digital volume control 32 illustrates a more detailed embodiment of digital volume control 22 in accordance with one embodiment of the present invention. Multiplier 36 attenuates the output of adder 34 (analogous to adder 24 of FIG. 2) using an attenuation factor of A. (Note that multiplier 36 actually receives the inverse attenuation factor, 1/A.) Therefore, the output of multiplier 36 provides y(z) which is (1/A*(x(z)+frequency shaped attenuation error)). Note that the frequency shaped attenuation error may also include residual error from previous loop iterations.

Error determination unit 48 includes multiplier 44 and adder 46. Multiplier 44 reverses the attenuation performed by multiplier 36 by multiplying y(z) by A. Therefore, the output of multiplier 44 is simply the unattenuated representation of (x(z)+frequency shaped attenuation error) in addition to the attenuation error introduced by multiplier 36 in the current loop iteration. Adder 46 determines the difference between the input to multiplier 36 and output of multiplier 44 to obtain $y_e(z)$ which represents the accumulated attenuation error introduced by multiplier 36 due to prior loop iterations.

Filter 42 includes frequency shaper 40 and delay 38. Frequency shaper 40 receives $y_e(z)$ and frequency shapes $y_e(z)$ by applying a transfer function H(z) where $H(z)=2-z^{-1}$. The transfer function, H(z), only allows the error which falls within the predetermined digital audio range (discussed above) to be introduced back into the loop (via delay 38 and adder 34). In this manner, the subsequent loop iteration will have a decreased attenuation error in the predetermined digital audio range. In the embodiment of FIG. 3, filter 42 uses a first order frequency shaping algorithm, however alternate embodiments may use higher order algorithms. Alternatively, other transfer functions may be used depending on the various factors, such as the predetermined digital audio range and the oversampling ratio. The output of frequency shaper 40 is delayed by delay 38, where delay 38, in one embodiment, is equivalent to one period of the oversampling ratio.

The embodiments of digital volume control 14 illustrated in FIGS. 2 and 3 provide an attenuated output y(z) having a substantially constant SNR and THD with respect to the level of attenuation. The use of error determination unit 28 and filter 30 effectively shift the attenuation error (i.e. noise) introduced by attenuator 26 beyond a predetermined digital audio range thus resulting in a substantially constant SNR and THD over the predetermined digital audio range.

Alternate embodiments of FIGS. 2 and 3 may also use a filter in addition to attenuator 26 or 36. In these embodiments, error detection unit 28 or 48 would also include an inverse filter unit in order to compensate for the transfer function of the added filter and determine the error introduced by the filter. Therefore, in addition to multiplier 36, digital volume control 32 would also include a filter, and in addition to multiplier 44, digital volume control 32 would include an inverse filter.

Although the system of FIG. 1 illustrates outputting an audio signal via a speaker, digital volume control 14 may be used in a variety of different systems. For example, an audio mixer may use a digital volume control (such as digital volume control 22 or 32) at the output of each channel prior to mixing in order to reduce the effect of the resulting aggregate attenuation noise.

In the foregoing specification, the invention has been described with reference to specific embodiments. However, one of ordinary skill in the art appreciates that various modifications and changes can be made without departing from the scope of the present invention as set forth in the claims below. For example, the digital volume control of FIGS. 2 and 3 may be implemented in hardware, software, or in a combination of hardware and software. For example, in one embodiment, the multipliers may be implemented as shift registers. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A digital audio system, comprising:
    a digital audio processor for receiving and processing a digital audio signal to generate a processed digital audio signal; and
    a digital volume control, coupled to the digital audio processor, the digital volume control comprising:
        a first summation unit having a first input for receiving the processed audio signal, a second input for receiving a frequency shaped error signal; and an output for providing a composite digital audio signal;
        an attenuator having an input for receiving the composite digital audio signal, and in response, the attenuator providing an attenuated digital audio signal at an output;
        an error determination unit having an input coupled to the output of the attenuator, the error determination unit for determining an error induced in the attenuated digital audio signal by the attenuator; and
        a filter having an input coupled to an output of the error determination unit, for receiving the error, and in response, providing the frequency shaped error signal to the second input of the first summation unit;
        wherein the error determination unit comprises:
            a multiplier having a first input for receiving the attenuated digital audio signal, a second input for receiving an attenuation factor, and an output for providing an intermediate result; and
            a second summation unit having a first input for receiving the intermediate result, a second input for receiving the composite digital audio signal, and an output for providing the error.

2. The digital audio system of claim 1, wherein the filter uses a first-order frequency shaping algorithm to generate the frequency shaped error signal.

3. The digital audio system of claim 1, wherein the digital volume control is characterized as being an over-sampled digital volume control.

4. The digital audio system of claim 1, wherein the attenuator comprises a multiplier having a first input for receiving the composite digital audio signal, a second input for receiving an inverse attenuation factor, and an output for providing the attenuated digital audio signal.

5. The digital audio system of claim 1, wherein the multiplier is implemented as a shift register.

6. The digital audio system of claim 1, further comprising a digital-to-analog converter having an input coupled to the output of the attenuator, and an output for providing an analog counterpart of the attenuated digital audio signal.

7. The digital audio system of claim 6, further comprising an audio amplifier having an input coupled to the output of the digital-to-analog converter, and an output coupled to drive a speaker.

8. A digital audio system having a digital volume control, the digital volume control, comprising:
   a first summation unit having a first input for receiving a digital audio signal, a second input for receiving a frequency shaped error signal; and an output for providing a composite digital audio signal;
   an attenuator having a first input for receiving the composite digital audio signal, a second input for receiving an attenuation factor, and in response, the attenuator providing an attenuated digital audio signal at an output of the attenuator;
   an error determination unit having an input coupled to the output of the attenuator, the error determination unit for determining an error induced in the attenuated digital audio signal by the attenuator; and
   a filter having an input coupled to an output of the error determination unit, for receiving the error, and in response, providing the frequency shaped error signal to the second input of the first summation unit;
   wherein the error determination unit comprises:
      a mulitiplier having a first input for receiving the attenuated digital audio signal, a second input for receiving the attenuation factor, and an output for proving an intermediate result; and
      a second summation unit having a first input for receiving the intermediate result, a second input for receiving the composite digital audio signal, and an output fort providing the error.

9. The digital audio system of claim 8, wherein the filter uses a first-order frequency shaping algorithm to generate the frequency shaped error signal.

10. The digital audio system of claim 8, wherein the digital volume control is characterized as being an over-sampled digital volume control.

11. The digital audio system of claim 8, wherein the attenuator comprises a multiplier having a first input for receiving the composite digital audio signal, a second input for receiving an inverse attenuation factor that is a reciprocal of the attenuation factor, and an output for providing the attenuated digital audio signal.

12. The digital audio system of claim 8, wherein the multiplier is implemented as a shift register.

13. The digital audio system of claim 8, further comprising a digital-to-analog converter having an input coupled to the output of the attenuator, and an output for providing an analog counterpart of the attenuated digital audio signal.

14. In a digital audio system having a digital volume control, a method for digitally attenuating an audio output signal comprising the steps of:
   receiving a digital audio signal,
   adding the digital audio signal to a filtered error signal to produce a composite digital audio signal;
   attenuating the composite digital audio signal based on an attenuation factor to generate an attenuated digital audio signal, wherein the attenuating the composite digital audio signal comprises multilying the composite digital audio signal by an inverse attenuation factor to produce the attenuated digital audio signal, wherein the inverse attenuation factor is a reciprocal of the attentuation factor;
   determining an error induced in the attenuated digital audio signal by the attenuator, wherein the determining the error induced in the attenuated digital audio signal comprises:
      multiplying the attenuated digital audio signal by the attenuation factor to produce an intermediate result; and
      adding the intermediate result to the composite digital audio signal to produce the error; and
   filtering the error to produce the filtered error signal.

15. The method of claim 14, wherein the step of filtering further comprises using a first-order frequency shaping algorithm to generate a frequency shaped filtered error signal.

\* \* \* \* \*